United States Patent
Dike et al.

(10) Patent No.: US 6,989,695 B2
(45) Date of Patent: Jan. 24, 2006

(54) APPARATUS AND METHOD FOR REDUCING POWER CONSUMPTION BY A DATA SYNCHRONIZER

(75) Inventors: Charles E. Dike, Hillsboro, OR (US); David J. Hawkins, Austin, TX (US)

(73) Assignee: Intel Corporation, Santa Clara, CA (US)

(*) Notice: Subject to any disclaimer, the term of this patent is extended or adjusted under 35 U.S.C. 154(b) by 264 days.

(21) Appl. No.: 10/454,651

(22) Filed: Jun. 4, 2003

(65) Prior Publication Data

US 2004/0246810 A1 Dec. 9, 2004

(51) Int. Cl.
*H03L 7/00* (2006.01)

(52) U.S. Cl. .................... 327/142; 141/155

(58) Field of Classification Search .......... 327/141, 327/142, 144, 145, 154, 155, 199, 218, 225, 327/230, 217; 326/93; 375/354; 377/77, 377/78, 80, 81
See application file for complete search history.

(56) References Cited

U.S. PATENT DOCUMENTS

| | | | | |
|---|---|---|---|---|
| 4,949,361 A | * | 8/1990 | Jackson | 375/371 |
| 5,256,912 A | * | 10/1993 | Rios | 327/144 |
| 5,289,518 A | * | 2/1994 | Nakao | 377/81 |
| 5,498,988 A | * | 3/1996 | Reyes et al. | 327/199 |
| 5,548,285 A | * | 8/1996 | Ford et al. | 341/100 |
| 5,640,130 A | * | 6/1997 | Ito et al. | 331/75 |
| 5,654,988 A | * | 8/1997 | Heyward et al. | 375/355 |
| 5,692,166 A | * | 11/1997 | Milhizer et al. | 713/400 |
| 5,896,052 A | * | 4/1999 | Gujral et al. | 327/144 |
| 5,905,766 A | * | 5/1999 | Nguyen | 375/354 |
| 5,912,572 A | * | 6/1999 | Graf, III | 327/144 |
| 6,021,504 A | * | 2/2000 | Yamasaki | 713/400 |
| 6,101,609 A | * | 8/2000 | Kawasaka | 713/322 |
| 6,108,778 A | * | 8/2000 | LaBerge | 713/1 |
| 6,260,152 B1 | * | 7/2001 | Cole et al. | 713/400 |
| 6,674,821 B1 | * | 1/2004 | Mejyr | 375/354 |

\* cited by examiner

*Primary Examiner*—Timothy P. Callahan
*Assistant Examiner*—Hai L. Nguyen
(74) *Attorney, Agent, or Firm*—Buckley, Maschoff & Talwalkar LLC

(57) ABSTRACT

An apparatus includes at least one logic storage unit which has a clock input. The apparatus also includes a logic circuit associated with the at least one logic storage unit. The logic circuit is capable of selectively preventing a clock signal from being applied to the clock input of the at least one logic storage unit.

5 Claims, 10 Drawing Sheets

APPARATUS AND METHOD FOR REDUCING POWER CONSUMPTION BY A DATA SYNCHRONIZER

BACKGROUND

Devices that operate at different clock rates may be coupled together such that one of the devices provides an input signal to a second one of the devices. The second device may include a data synchronizer circuit to synchronize the input signal from the first device with the clock signal of the second device.

Some devices, such as some processors, may include a considerable number of data synchronizer circuits, which may consume a substantial portion of the total power consumed by the device.

DETAILED DESCRIPTION

Figure 1:
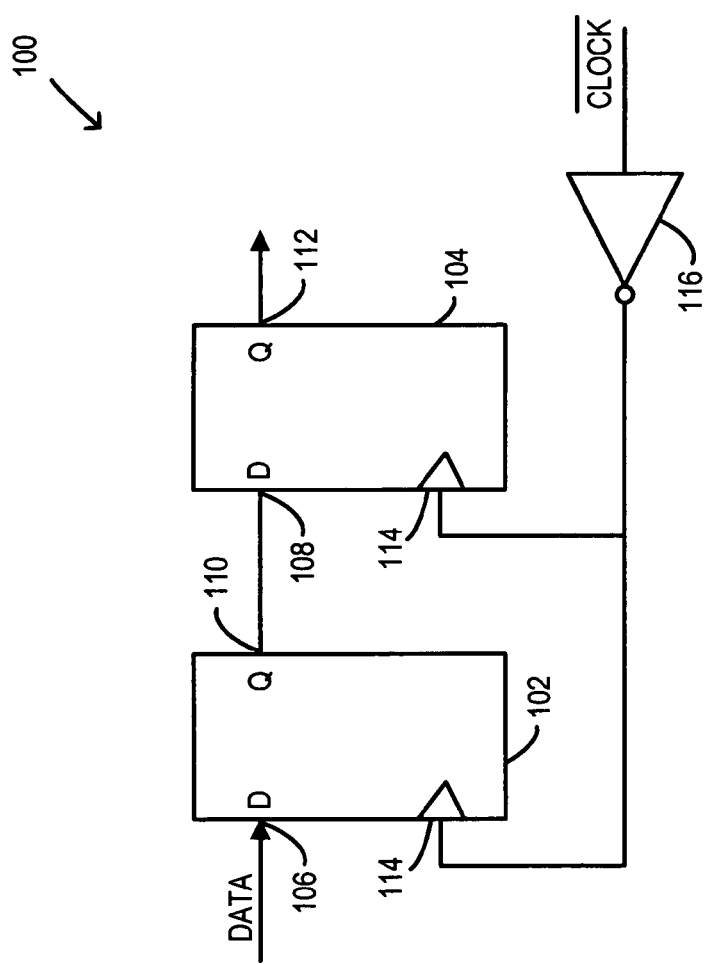
FIG. 1 is a schematic logic diagram of a conventional data synchronizer circuit.

FIG. 1 is a schematic logic diagram of a conventional data synchronizer circuit 100. The data synchronizer circuit 100 includes D-type flip-flops 102, 104. The first flip-flop 102 has a data (D) input 106 that is coupled to receive an input data signal that is to be synchronized with a clock signal that drives the flip-flops 102, 104. The second flip-flop 104 has a D input 108 that is coupled to the state (Q) output 110 of the first flip-flop 102. The synchronized input signal provided by the data synchronizer circuit 100 is present at the Q output 112 of the second flip-flop 104.

An inverted clock signal CLOCK~ is coupled to the clock inputs 114 of the flip-flops 102, 104 via an inverter 116.

When the data signal input to the D input 106 of the first flip-flop 102 changes state, the change is clocked through the flip-flops 102, 104 until the signal output from the Q output 112 of the second flip-flop 104 changes state in synchronism with the clock signal applied to the clock input 114 of the second flip-flop 104. Thus the output of the second flip-flop 104, which is also the output of the data synchronizer circuit, follows the input to the data synchronizer circuit, but is synchronized with the local clock.

Figure 2:
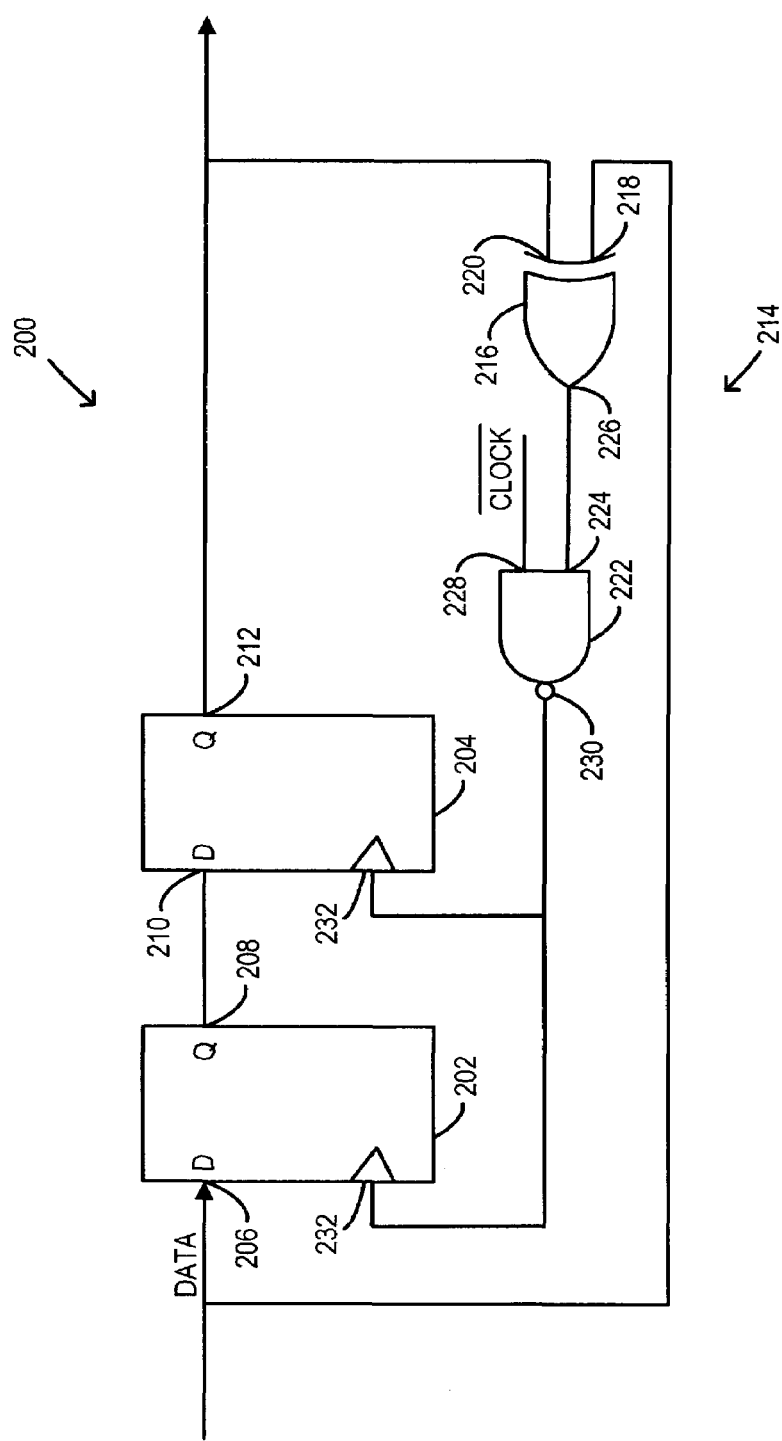
FIG. 2 is a schematic logic diagram of a data synchronizer circuit according to some embodiments.

FIG. 2 is a schematic logic diagram of a data synchronizer circuit 200 according to some embodiments.

The data synchronizer circuit 200 includes D-type flip-flops 202, 204. The flip-flops 202, 204 may themselves be conventional devices. The first flip-flop 202 has a data (D) input 206, to which an input signal (which is the signal to be synchronized to the local clock) is coupled. The first flip-flop 202 also has a state (Q) output 208 which is coupled to a data (D) input 210 of the second flip-flop 204. The second flip-flop 204 also has a state (Q) output 212 which provides the synchronized input signal which is the output from the data synchronizer circuit 200.

The data synchronizer circuit 200 also includes a clock-gating logic circuit 214 which is associated with the flip-flops 202, 204. The clock-gating logic circuit 214 includes an XOR (exclusive OR) gate 216, which has a first input 218 coupled to receive the input data signal which is also applied to the D input 206 of the first flip-flop 202, and a second input 220 which is coupled to receive the output of the data synchronizer circuit 200. (That is, the second input 220 of the XOR gate 216 is coupled to the Q output 212 of the second flip-flop 204.)

The clock-gating logic circuit 214 also includes a NAND gate 222, which has a first input 224 coupled to the output 226 of the XOR gate 216 and a second input 228 coupled to receive the inverted local clock signal CLOCK~. The output 230 of the NAND gate 222 is coupled to the clock inputs 232 of the flip-flops 202, 204.

Figure 3:
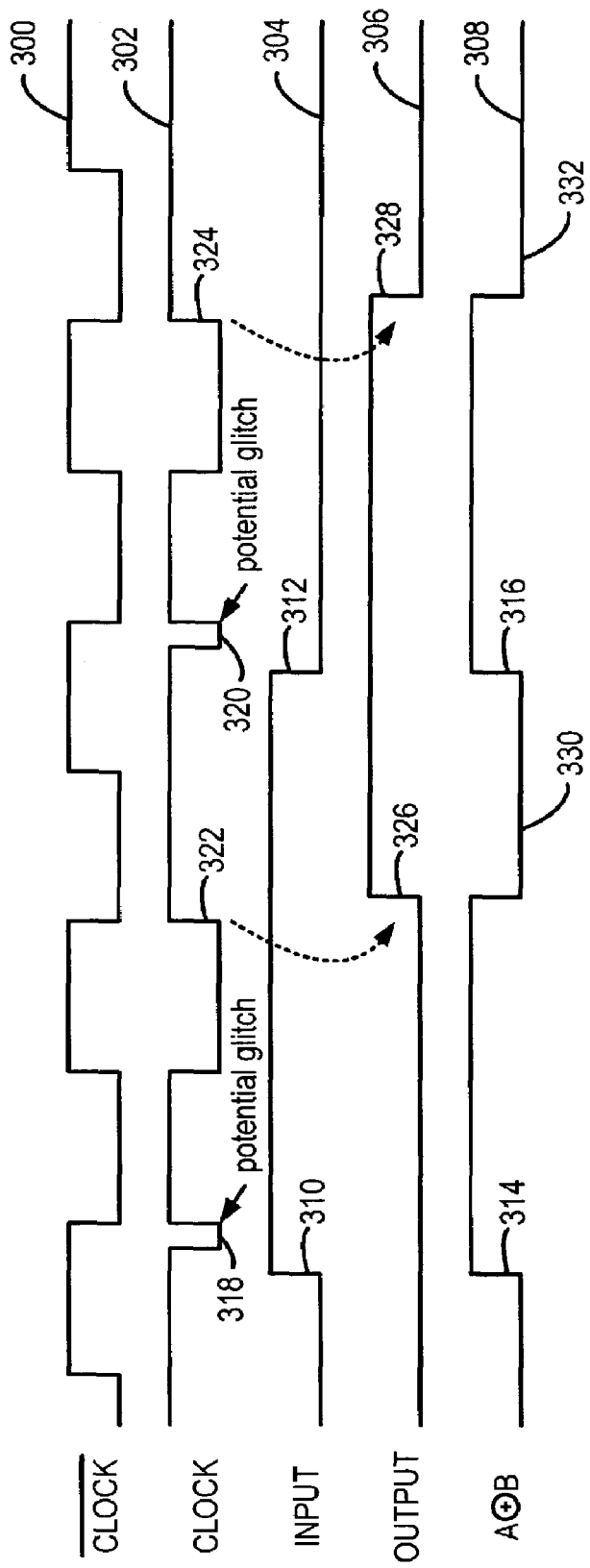
FIG. 3 is a waveform diagram that illustrates various signals present in the data synchronizer circuit of FIG. 2.

FIG. 3 is a waveform diagram that illustrates examples of various signals that may be present in the data synchronizer circuit 200. FIG. 3 includes a first trace 300 which represents the inverted local clock CLOCK~ which is applied to the input 228 of the NAND gate 222. FIG. 3 also includes a second trace 302 which represents the signal CLOCK which is applied to the clock inputs 232 of the flip-flops 202, 204 from the output 230 of the NAND gate 222. Also shown in FIG. 3 are a third trace 304 which represents the input data signal applied to the D input 206 of the first flip-flop 202, and a fourth trace 306 which represents the output signal of the data synchronizer circuit 200 provided at the Q output 212 of the second flip-flop 204. Finally, FIG. 3 also shows a fifth trace 308 which represents the signal output from the XOR gate 216 and applied to the input 224 of the NAND gate 222.

Operation of the data synchronizer circuit 200 will now be described with reference to FIGS. 2 and 3.

When the input and output signals (traces 304 and 306, respectively) of the data synchronizer circuit 200 have the same state (i.e., both low or both high), the output of the XOR gate (trace 308) is low, so that the signal CLOCK (output of the NAND gate 222, trace 302) applied to the clock inputs 232 of the flip-flops 202, 204 is held high. Thus the clock-gating circuit 214 effectively blocks or "gates off" the transitions of the inverted local clock signal CLOCK~ when the data synchronizer circuit 200 is waiting for the input signal to change state.

When the input signal changes state, as illustrated at 310 or 312 in FIG. 3, the output of the XOR gate (trace 308) goes high, as illustrated at 314 or 316. With the output of the XOR gate high, the NAND gate 222 functions as an inverter for the inverted local clock signal CLOCK~, and transitions in CLOCK~ are passed on in inverted form to the clock inputs 232 of the flip-flops 202, 204. Depending on the timing of the transition in the input signal relative to CLOCK~, a shortened pulse or "glitch" may be produced in the signal applied to the clock inputs 232, as indicated at 318 or 320 in FIG. 3. If the "glitch" is sufficiently wide, the trailing (upward going) edge of the "glitch" may clock the first flip-flop 202 to change state to follow the change in the input signal. At the next upward going transition in CLOCK, indicated at 322 or 324, the second flip-flop 204 is clocked to change state to follow the output of the first flip-flop 202, thereby causing the output of data synchronizer circuit 200 to follow the change in the input signal, in synchronism with the local clock, as indicated at 326, 328. At this point, the output of the XOR gate 216 again goes low (330, 332; FIG. 3), so that the local clock is again gated off from the flip-flops 202, 204.

In the event that the glitch is too short to clock the first flip-flop, or the transition in the input signal occurs while CLOCK~ is low, the transition in the output signal may be delayed by one cycle of the local clock, which is not a problem.

Because the local clock is gated off while the data synchronizer circuit 200 awaits the next transition in the input signal, the number of clock transitions applied to the flip-flops may be significantly reduced, which may result in a substantial reduction in the amount of power consumed by the data synchronizer circuit 200 as compared to a conventional synchronizer. Nevertheless, the data synchronizer circuit 200 is able to respond substantially immediately to transitions in the input signal, since the gating off of the clock signal is removed as soon as the transition in the input signal occurs.

As is conventional in some synchronizers, the data synchronizer circuit 200 employs a series of two D-type flip-flops to aid in handling a situation in which the first flip-flop enters a metastable state that is neither high nor low. This may occur if the transition in the input signal is close in time to a clock edge. With the delay involved in moving the signal transition through the two flip-flops, time is available for the metastable state to be resolved, so that a proper low or high output is provided by the data synchronizer circuit as a whole. Instead of the series of two flip-flops shown in FIG. 2, a series of three or more flip-flops may be provided, to allow even more time for resolution of a metastable state.

Figure 4:
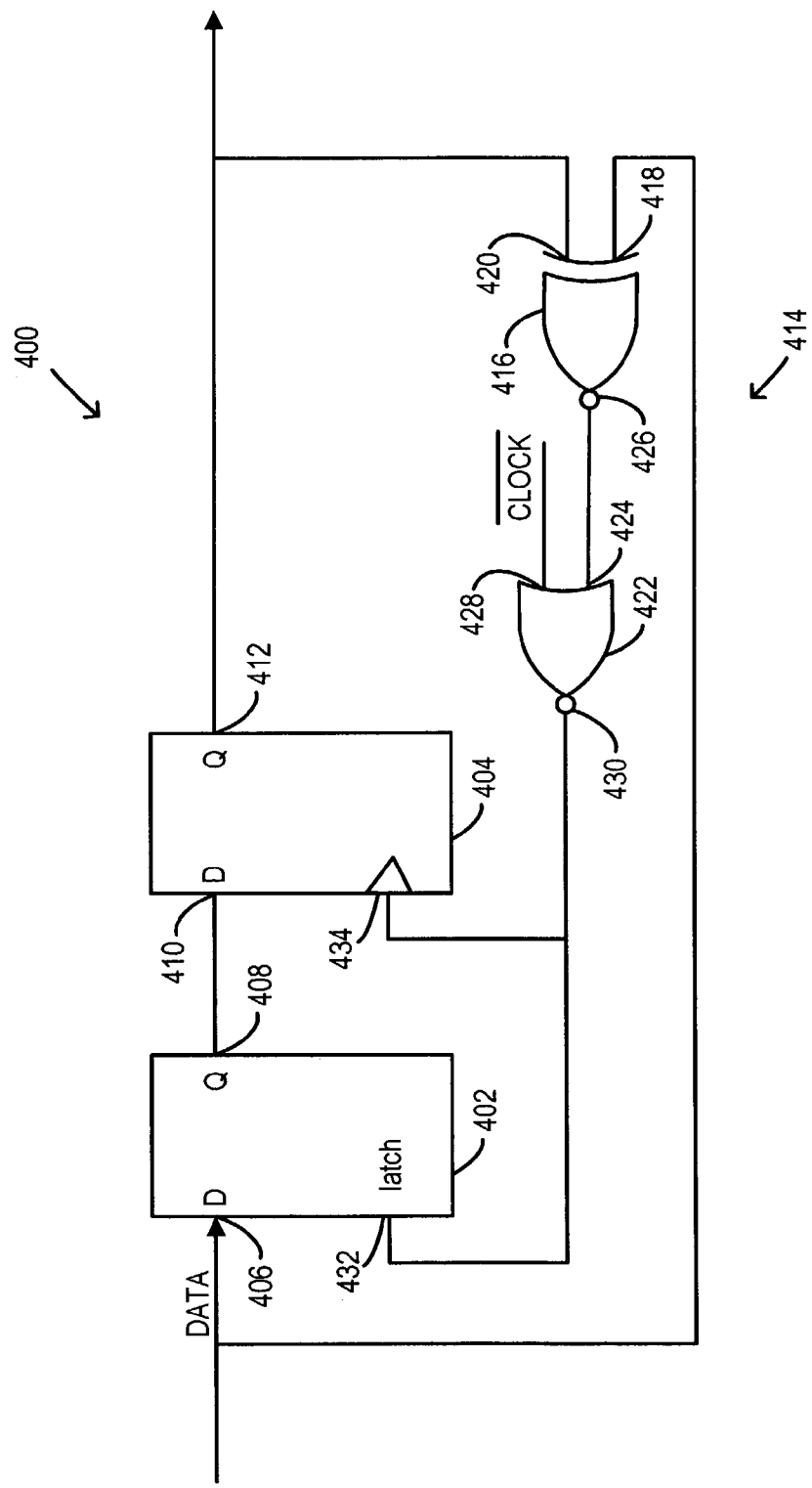
FIG. 4 is a schematic logic diagram of a data synchronizer circuit according to some embodiments.

FIG. 4 is a schematic logic diagram of a data synchronizer circuit 400 according to some other embodiments.

The data synchronizer circuit 400 includes a transparent latch 402 and a D-type flip-flop 404. The transparent latch 402 and the D-type flip-flop 404 may themselves be conventional devices.

The transparent latch 402 has a data (D) input 406, to which an input signal (which is the signal to be synchronized to the local clock) is coupled. The transparent latch 402 also has a state (Q) output 408 which is coupled to a data (D) input 410 of the flip-flop 404. The flip-flop 404 has a state (Q) output 412 which provides the synchronized input signal which is the output from the data synchronizer circuit 400.

The data synchronizer circuit 400 also includes a clock-gating logic circuit 414 which is associated with the transparent latch 402 and the flip-flop 404. The clock-gating logic circuit 414 includes an XNOR (exclusive NOR) gate 416, which has a first input 418 coupled to receive the input data signal which is also applied to the D input 406 of the transparent latch 402, and a second input 420 which is coupled to receive the output of the data synchronizer circuit 400. (That is, the second input 420 of the XNOR gate 416 is coupled to the Q output 412 of the flip-flop 404.)

The clock-gating logic circuit 414 also includes a NOR gate 422, which has a first input 424 coupled to the output 426 of the XNOR gate 416 and a second input 428 coupled to receive the inverted local clock signal CLOCK~. The output 430 of the NOR gate 422 is coupled to the latch input 432 of the transparent latch 402 and to the clock input 434 of the flip-flop 404.

Figure 5:
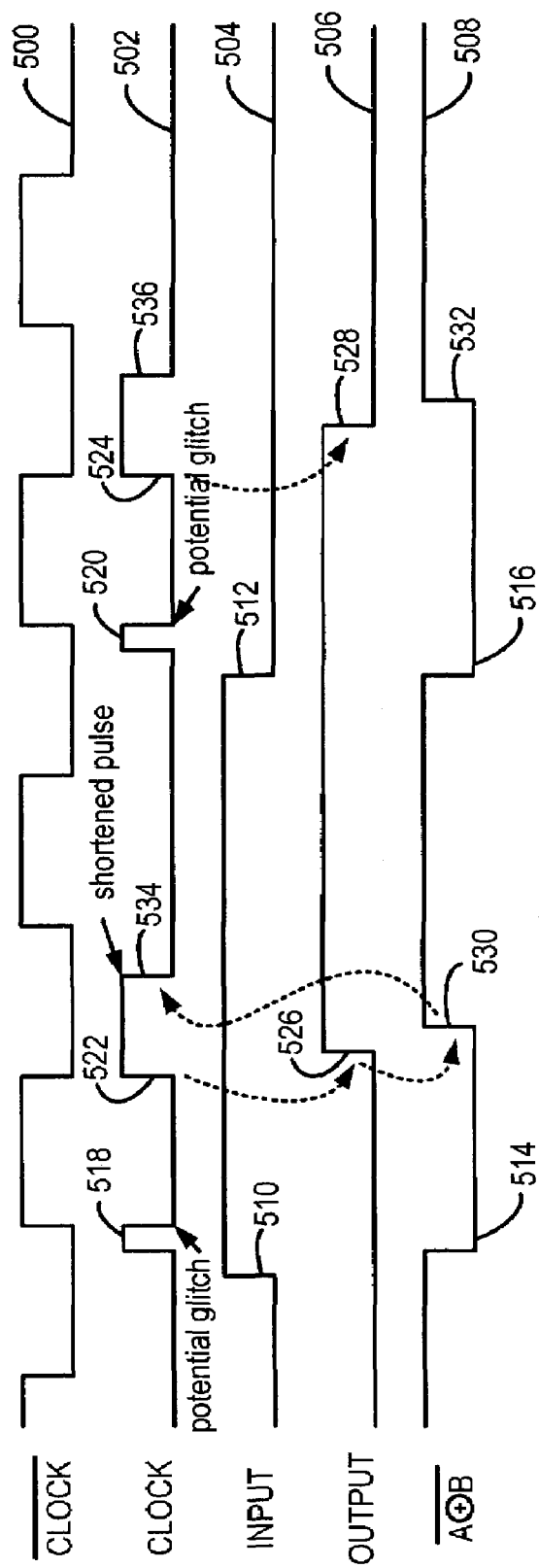
FIG. 5 is a waveform diagram that illustrates various signals present in the data synchronizer circuit of FIG. 4.

FIG. 5 is a waveform diagram that illustrates examples of various signals that may be present in the data synchronizer circuit 400. FIG. 5 includes a first trace 500 which represents the inverted local clock CLOCK~ which is applied to the input 428 of the NOR gate 422. FIG. 5 also includes a second trace 502 which represents the signal CLOCK which is applied to the latch input 432 of the transparent latch 402 and to the clock input 434 of the flip-flop 404 from the output 430 of the NOR gate 422. Also shown in FIG. 5 are a third trace 504 which represents the input data signal applied to the D input 406 of the transparent latch 402, and a fourth trace 506 which represents the output signal of the data synchronizer circuit 400 provided at the Q output 412 of the flip-flop 404. Finally, FIG. 5 also shows a fifth trace 508 which represents the signal output from the XNOR gate 416 and applied to the input 424 of the NOR gate 422.

The transparent latch 402 differs from the D-type flip-flops discussed above, in that the D-type flip-flops change their state (output signal) only in response to a rising edge of the signal applied to their clock inputs, whereas the state of the transparent latch 402 follows the state of its D input as long as the signal applied to its latch input is high, and the output of the transparent latch is latched when the signal applied to the latch input is low. (The latch input of the transparent latch may also be considered to be a "clock input" in that the clock signal is applied to the latch input.)

Operation of the data synchronizer circuit 400 will now be described with reference to FIGS. 4 and 5.

When the input and output signals (traces 504 and 506, respectively) of the data synchronizer circuit 400 have the same state (i.e., both low or both high), the output of the XNOR gate (trace 508) is high, so that the signal CLOCK (output of the NOR gate 422, trace 502) applied to the latch input 432 of the transparent latch 402 and to the clock input 434 of the flip-flop 404 is held low. Thus the clock-gating logic circuit 414 effectively blocks or "gates off" the transitions of the inverted local clock signal CLOCK~ when the data synchronizer circuit 400 is waiting for the input signal to change state.

When the input signal changes state, as illustrated at 510 or 512 in FIG. 5, the output of the XNOR gate (trace 508) goes low, as illustrated at 514 or 516. With the output of the XNOR gate low, the NOR gate 422 functions as an inverter for the inverted local clock signal CLOCK~, and the states and transitions in CLOCK~ are passed on in inverted form to the latch input 432 of the transparent latch 402 and to the clock input 434 of the flip-flop 404. If CLOCK~ happens to be low when the input signal transitions (as shown in the example of FIG. 5), CLOCK immediately goes high (as indicated at 518 or 520) on the transition in the input signal, and the state of the transparent latch 402 follows the (changed) state of the input signal. Then, at the next rising edge of CLOCK (indicated at 522 or 524), the flip-flop 404 changes state to follow the state of the transparent latch 402, thereby causing the output signal of the data synchronizer circuit 400 to transition, as shown at 526 or 528. The transition in the output of the data synchronizer circuit 400 causes the output of the XNOR gate 416 to go high (indicated at 530, 532), which sends CLOCK low (indicated at 534, 536), to be held low until the next input signal transition.

As was the case with the data synchronizer circuit 200 of FIG. 2, the data synchronizer circuit 400 has the clock signal gated off while awaiting the next transition of the input signal. Consequently, the number of clock transitions applied to the transparent latch and the flip-flop may be substantially reduced, which may substantially reduce the amount of power that is consumed by the synchronizer. Also, the gating of the clock is immediately released in response to the change in transition of the input signal, so that the responsiveness of the synchronizer is not greatly reduced.

Figure 6:
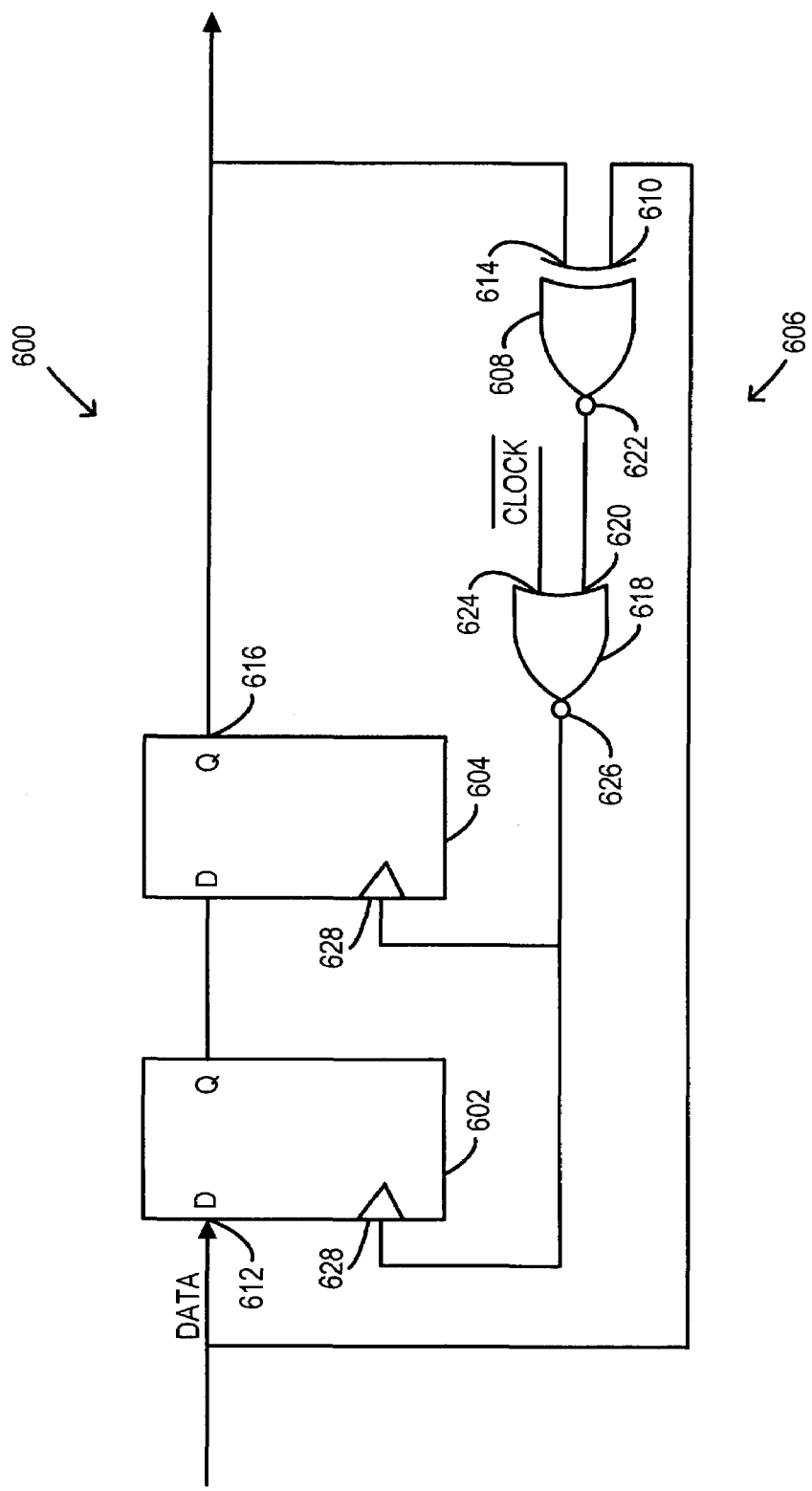
FIG. 6 is a schematic logic diagram of a data synchronizer circuit according to some embodiments.

FIG. 6 is a schematic logic diagram of another alternative embodiment of a data synchronizer circuit. The data synchronizer circuit 600 of FIG. 6 includes D-type flip-flops 602, 604 arranged in the same fashion as in the synchronizer of FIG. 2, but with a clock-gating logic circuit 606 that is like the clock-gating logic circuit 414 of FIG. 4. Specifically, the clock-gating logic circuit 606 of FIG. 6 includes an XNOR gate 608 having a first input 610 coupled to receive the input signal supplied to the data synchronizer circuit 600 (which is the signal supplied to the D input 612 of the first flip-flop 602) and a second input 614 coupled to the Q output 616 of the second flip-flop 604 so as to receive the signal output from the data synchronizer circuit 600. The clock gating circuit also includes a NOR gate 618 having a first input 620 coupled to the output 622 of the XNOR gate 608 and a second input 624 coupled to receive the inverted local clock CLOCK~. The output 626 of the NOR gate 618 is coupled to the clock inputs 628 of the flip-flops 602, 604.

Operation of the data synchronizer circuit 600 is similar to that of the data synchronizer circuit 200 of FIG. 2, with the exception that the signal applied to the clock inputs of the flip-flops of the data synchronizer circuit 200 is held low, rather than high, when the input matches the output of the data synchronizer circuit 200. As before, the number of clock transitions applied to the flip-flops may be reduced, thereby conserving power consumption.

Figure 7:
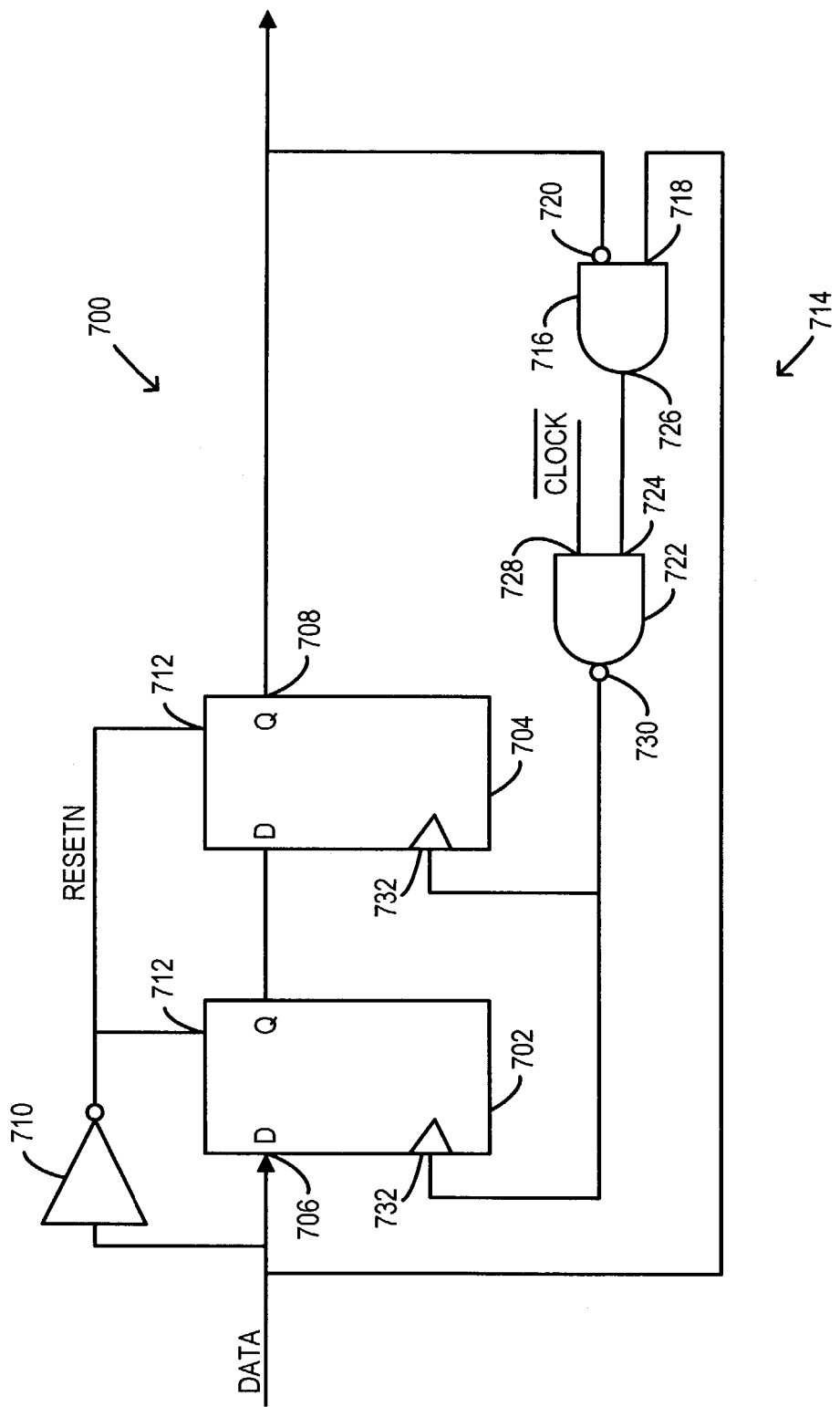
FIG. 7 is a schematic logic diagram of a synchronizer circuit according to some embodiments.

FIG. 7 is a schematic logic diagram of still another alternative embodiment of a synchronizer circuit. The synchronizer circuit 700 of FIG. 7 includes D-type flip-flops 702, 704 arranged relative to each other in the same fashion as in the data synchronizer circuit of FIG. 2. The first flip-flop 702 has a D input 706 to which the input signal is coupled. The second flip-flop has a Q output 708 that provides the output from the synchronizer circuit 700. The input signal is also coupled via an inverter 710 to reset inputs 712 of the flip-flops 702, 704.

A clock-gating logic circuit 714 is associated with the flip-flops 702, 704 and includes an AND gate 716. The AND gate 716 has a first input 718 coupled to receive the input signal, and a second (inverted) input 720, coupled to the Q output 708 of the second flip-flop 704. The clock-gating logic circuit 714 also includes a NAND gate 722 which has a first input 724 coupled to the output 726 of the AND gate 716 and a second input 728 coupled to receive an inverted local clock signal CLOCK~. The output 730 of the NAND gate 722 is coupled to clock inputs 732 of the flip-flops 702, 704.

The synchronizer circuit 700 may be used to pass a low-to-high transition in the input signal (e.g., an interrupt signal) at a timing that is synchronized with the local clock. In a stand-by state of the data synchronizer circuit 700, both input and output signals are low. The state of the AND gate 716 is low, so that the output of the NAND gate is held high, effectively gating off the clock signal that would otherwise be applied to the flip-flops 702, 704.

When a low-to-high transition occurs in the input signal, reset is no longer asserted for the flip-flops 702, 704, and the AND gate 716 goes high. With the AND gate 716 providing a "high" output, NAND gate 722 functions as an inverter relative to the local clock CLOCK~, which is therefore applied in inverted form to the flip-flops 702, 704. The low-to-high transition is then clocked through the flip-flops 702, 704 and emerges from the Q output 708 of the second flip-flop 704 in synchronism with the local clock. When the output signal goes high, the AND gate 716 goes low again, so that the clock signal to the flip-flops is gated off again, with the clock inputs 732 again held high.

Once the input signal transitions from high to low, reset is asserted for the flip-flops and the synchronizer circuit 700 enters the stand-by state again, with both input and output signals low and the clock signal still gated off.

As in previously described embodiments, the synchronizer circuit 700 may have relatively low power consumption, since the clock signal is not applied to the flip-flops except when the synchronizer circuit 700 is triggered to leave the stand-by state by a low-to-high transition of the input signal.

Figure 8:
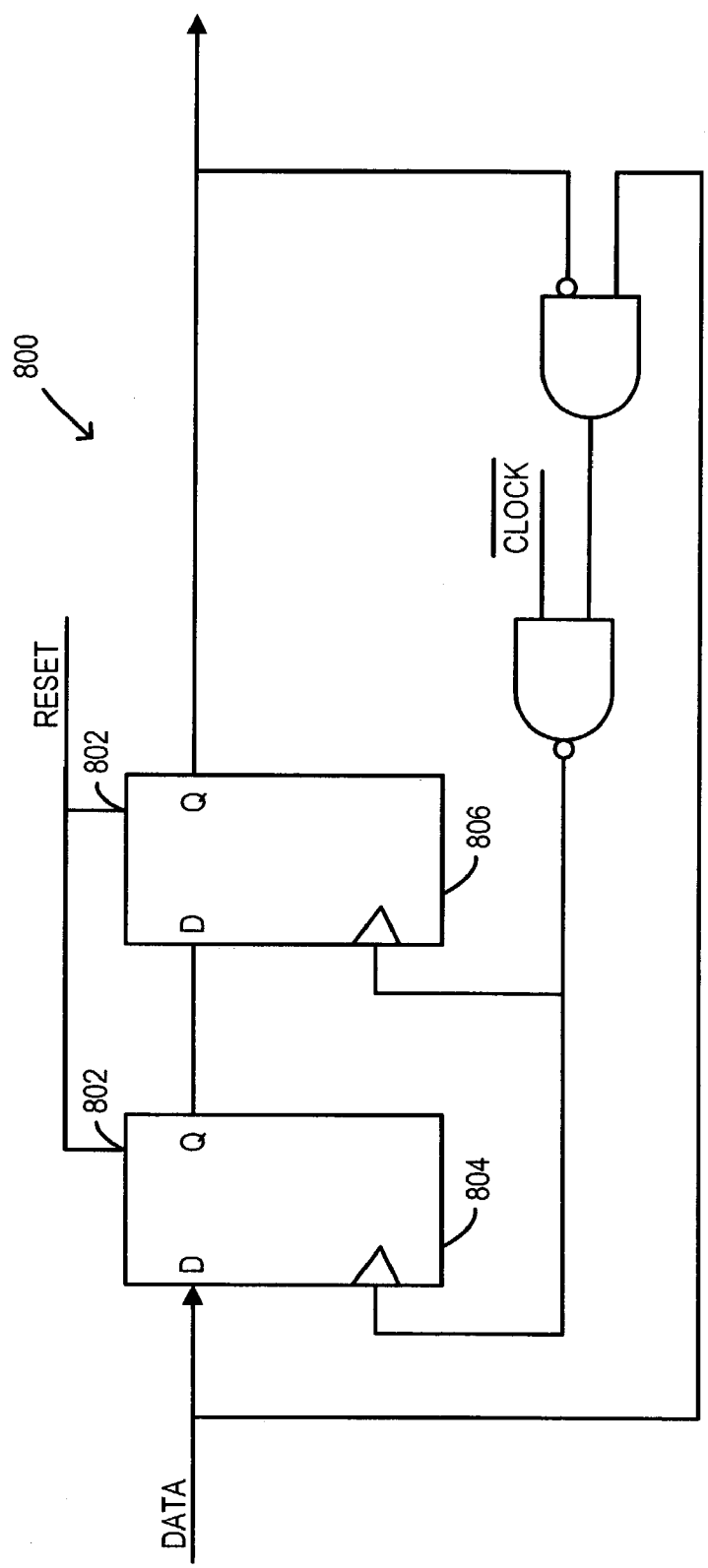
FIG. 8 is a schematic logic diagram of a synchronizer circuit according to some embodiments.

FIG. 8 is a schematic logic diagram of another embodiment of a synchronizer circuit. The synchronizer circuit 800 shown in FIG. 8 is similar to the synchronizer circuit 700 of FIG. 7, except that in the synchronizer circuit 800, the input signal is not coupled to the reset inputs 802 of the flip-flops 804, 806. Instead a reset signal may be provided from another portion (not shown) of a device (not separately shown) which receives the input signal and of which the synchronizer circuit is a part. More specifically, the reset signal may be provided by the receiving device after a low-to-high transition in the input signal has been transmitted through the synchronizer circuit 700. Together with the transition of the input signal back to low, the resetting of the flip-flops 804, 806 returns the synchronizer circuit 800 back to the stand-by state which is discussed above in connection with the synchronizer circuit 700 of FIG. 7.

Figure 9:
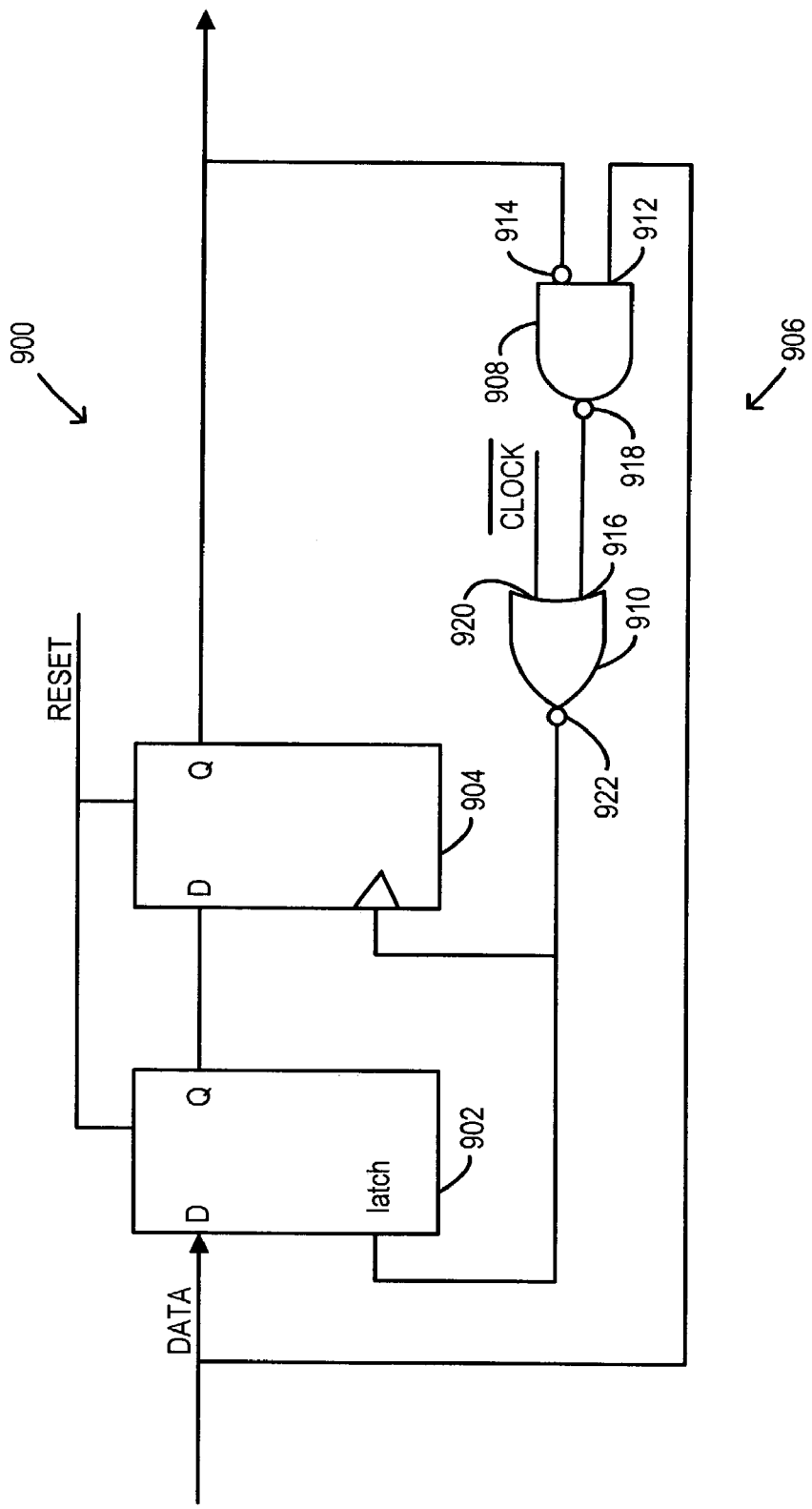
FIG. 9 is a schematic logic diagram of a synchronizer circuit according to some embodiments.

FIG. 9 is a schematic logic diagram of yet another embodiment of a synchronizer circuit.

The synchronizer circuit 900 of FIG. 9 includes a transparent latch 902 and a D-type flip-flop 904 which are arranged relative to each other like the transparent latch 402 and the D-type flip-flop 404 of the circuit 400 shown in FIG. 4. A clock-gating logic circuit 906 is associated with the transparent latch 902 and the flip-flop 904 and includes a NAND gate 908 and a NOR gate 910. A first input 912 of the NAND gate 908 is coupled to receive the input signal. A second input (inverting input) 914 of the NAND gate 908 is coupled to the Q output of the flip-flop 904. A first input 916 of the NOR gate 910 is coupled to the output 918 of the NAND gate 908. A second input 920 of the NOR gate 910 is coupled to receive the inverted local clock signal CLOCK~. The output 922 of the NOR gate 910 is coupled to the latch input of the transparent latch 902 and to the clock input of the flip-flop 904.

Like the synchronizer circuits 700, 800, the synchronizer circuit 900 of FIG. 9 may be used to pass a low-to-high transition in synchronism with the local clock. When the input and output signals of the synchronizer circuit are both low, the synchronizer circuit is in a stand-by state, with the output of the NAND gate 908 high and the output of the NOR gate 910 held low, so that the clock signal is gated off by the clock-gating logic circuit 906. When there is a low-to-high transition of the input signal, the NAND gate output goes low, causing the NOR gate to function like an inverter, with the local clock CLOCK~ being applied in inverted fashion to the transparent latch 902 and to the flip-flop 904. With the clock signal being applied to the transparent latch 902 and to the flip-flop 904, the low-to-high transition propagates through the transparent latch 902 and the flip-flop 904 and is output from the flip-flop 904 in synchronism with the local clock.

When this occurs, the output of the NAND gate again goes high, so that the output of the NOR again is held low, once more gating off the clock signal.

As was the case with the synchronizer circuit 800, a reset signal may be applied to the transparent latch 902 and to the flip-flop 904 from a portion of the receiving circuit of which the synchronizer circuit is a part. This, together with a high-to-low transition in the input signal, returns the synchronizer circuit 900 to the stand-by state.

As in previously described embodiments, the gating off of the clock signal, except when it is required to respond to the input signal, may reduce the amount of power that would otherwise be consumed by the synchronizer circuit 900.

Figure 10:
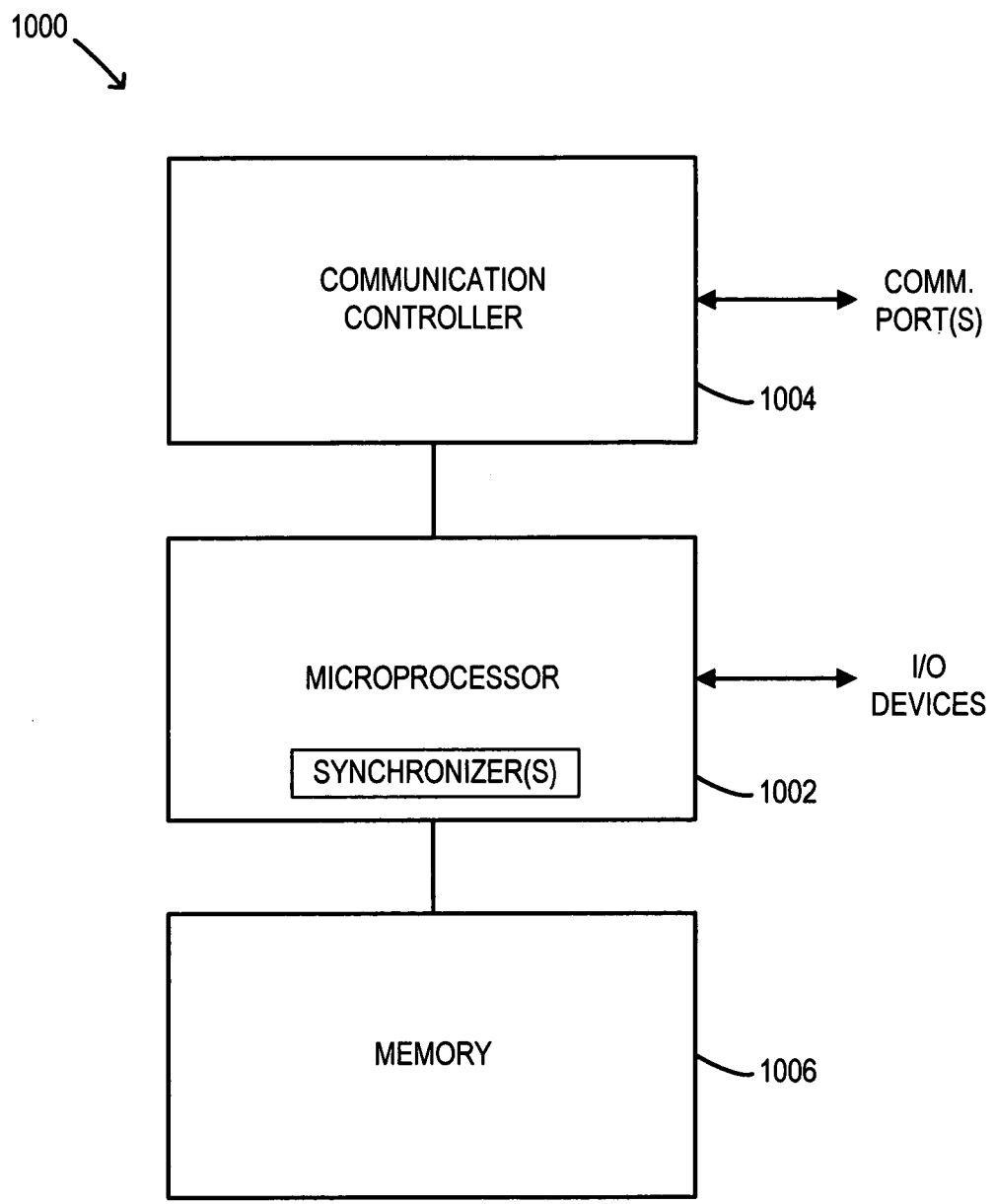
FIG. 10 is a block diagram of a data processing device that may include one or more data synchronizer circuits according to some embodiments.

FIG. 10 is a simplified block diagram of a data processing device 1000 that may incorporate one or more of the synchronizers described above. The data processing device 1000 includes a microprocessor 1002 and one or more communication controllers 1004 that are coupled to the microprocessor 1002. The microprocessor 1002 may operate at a first rate determined by a first clock signal, and each communication controller 1004 may operate at a second rate that is different from the first rate and is determined by a second clock signal. If there is more than one communication controller 1004, the communication controllers 1004 need not all operate at the same clock rate.

The microprocessor 1002 may include one or more of the synchronizers described above to translate input signals from the communication controllers 1004 into signals that are synchronized with the clock for the microprocessor.

The data processing device 1000 also includes one or more memory components 1006 coupled to the microprocessor 1002, which may constitute one or more of working memory, program storage and mass storage. The data processing device 1000 may also include other components which are not explicitly shown, such as one or more input/output devices coupled to the microprocessor 1002, and one or more communication ports coupled to the communication controllers 1004.

As used herein and in the appended claims, a "logic storage unit" refers to either or both of a flip-flop and a latch. "Gating off" a clock signal means preventing transitions of the clock signal from being applied to a clock input of a device such as a logic storage unit, and can be done, for example, by applying a constant high signal (holding a clock input high) or by applying a constant low signal (holding the clock input low).

In any one or more of the synchronizers described above, the two logic storage units shown may be replaced with one logic storage unit, or with three or more logic storage units.

As has been seen, in some embodiments, a synchronizer circuit may be provided which has an input signal and an output signal and which includes at least one logic storage unit. At a time when the level of the input signal matches the level of the output signal, the clock signal to the logic storage unit may be gated off.

In some embodiments, an apparatus includes at least one logic storage unit that has a clock input. The apparatus also includes a logic circuit associated with the at least one logic storage unit. The logic circuit is capable of selectively preventing a clock signal from being applied to the clock input of the at least one logic storage unit.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   a series of logic storage units, including a first logic storage unit having a data input coupled to receive an input signal, and a final logic storage unit having a state output, each of said logic storage units having a respective reset input;
   a first gate having a first input coupled to receive the input signal and a second input coupled to the state output of the final logic storage unit;
   a second gate having a first input coupled to receive a clock signal, a second input coupled to an output of the first gate, and an output coupled to respective clock inputs of the logic storage units; and
   an inverter having an input coupled to receive the input signal and an output coupled to the reset inputs of said logic storage units.

2. The apparatus of claim 1, wherein the final logic storage unit has a data input coupled to a state output of the first logic storage unit.

3. The apparatus of claim 1, wherein the first logic storage circuit is a D-type flip-flop.

4. The apparatus of claim 1, wherein the first gate is an AND gate and the second gate is a NAND gate.

5. The apparatus of claim 4, wherein the second input of the first gate is an inverting input.

\* \* \* \* \*